United States Patent [19]
Hollan

[11] 3,755,013

[45] Aug. 28, 1973

[54] LIQUID SOLUTION METHOD OF EPITAXIALLY DEPOSITING A SEMICONDUCTOR COMPOUND

[75] Inventor: Laszlo Hollan, Sevres, France

[73] Assignee: U.S. Philips Corporation, New York, N.Y.

[22] Filed: Apr. 1, 1971

[21] Appl. No.: 130,151

[30] Foreign Application Priority Data

Apr. 2, 1970 France .............................. 7011879

[52] U.S. Cl. ............. 148/172, 23/301 SP, 117/201, 118/429, 118/620, 148/1.5, 148/171

[51] Int. Cl. ......... H01l 7/38, B01j 17/20, B05r 3/02

[58] Field of Search .................. 148/171–173, 1.5; 23/301 SP; 117/201, 114; 118/429, 620

[56] References Cited

UNITED STATES PATENTS

| | | | |
|---|---|---|---|
| 3,558,373 | 1/1971 | Moody et al. | 148/171 |
| 3,585,087 | 6/1971 | Blum et al. | 148/171 |
| 3,647,578 | 3/1972 | Barnett et al. | 148/171 |
| 3,692,592 | 9/1972 | Marinelli | 148/172 |

OTHER PUBLICATIONS

Rupprecht, H., "New Aspects of Solution Regrowth–Gallium Arsenide" Proc. of 1966 Symposium on GaAs in Reading, Paper No. 9, p. 57–61.

Woodall et al., "Liquid Phase Epitaxial Growth of $Ga_{1-x}Al_xAs$" J. Electrochem. Soc., Vol. 116, No. 6, June 1969, p. 899–903.

Deitch, R. H., "Liquid–Phase Epitaxial Growth–Conditions" J. Crystal Growth, Vol. 7, No. 1, 1970, p. 69–73.

*Primary Examiner*—Hyland Bizot
*Assistant Examiner*—W. G. Saba
*Attorney*—Frank R. Trifari

[57] ABSTRACT

The invention relates to a method of epitaxially depositing a semiconductor compound from a saturated solution on a substrate. The temperature at the interface substrate-saturated solution is equal to the temperature at which the saturated solution is prepared in a part of the reactor situated above the substrate by leading vapour of a component of the compound over another component of the compound which serves as a solvent.

9 Claims, 5 Drawing Figures

INVENTOR.

BY LASZLO HOLLAN

AGENT

Patented Aug. 28, 1973

3,755,013

2 Sheets-Sheet 2

INVENTOR.

BY LASZLO HOLLAN

AGENT

LIQUID SOLUTION METHOD OF EPITAXIALLY DEPOSITING A SEMICONDUCTOR COMPOUND

The invention relates to a method of epitaxially depositing a semiconductor compound on a substrate, which deposition is carried out in a space in the presence of a vapour containing at least one component of the compound and in which a surface of the substrate is convered with a liquid, saturated solution of the compound in a solvent in the presence of the vapour and in which the solution is previously saturated in a part of the space, after which the solution is provided on the surface.

The invention also relates to a device in which the method is carried out.

The so-called VLS(vapour-liquid-solid) method of growing crystals can be used for the epitaxial deposition in small thicknesses on a substrate of the same material. Semiconductor compounds have thus been deposited in epitaxial layers for manufacturing electronic devices. In this method which is described, for example, in the French Patent specification No. 1,556,566, a liquid solution of the compound to be deposited is saturated in a suitable solvent and then contacted with the substrate on which the deposit is to be provided, the liquid phase being in contact with a vapour comprising at leat one component of the compound to be deposited.

In certain temperature conditions, the deposit is epitaxial. It is difficult, however, without special precautions, to obtain deposits having a high crystallographic quality of a uniform thickness and homogeneous composition.

When the quantities of solution used for the deposits are comparatively large, convection currents which may result in irregularities in the deposition are formed in the liquid phase. During the deposition the temperature in the space must vary so that first a liquid solution is obtained, then a seed crystal dissolves partly and oversaturation is then reached after which the crystallisation is maintained. This necessary temperature variation in time increases the difficulties of process control. The coefficient of distribution of impurities may vary with temperature and hence the deposit is heterogenous throughout its thickness. A homogeneous layer requires uniform temperature which can be obtained only after long stabilisation times and by means of very readily adapted heating devices.

It is the object of the invention to avoid the abovementioned drawbacks and to enable homogeneous expitaxial deposits of a high crystallographic quality and a regular thickness to be obtained. The method according to the invention endeavours to suppress all temperature variations in time so that a definite controlled stabilisation of the temperature distribution is obtained. Another object of the method is to use minimum quantities of material so as to disturb the stabilised temperatures as little as possible. Moreover, the method is carried out in a device having axial symmetry with an axis perpendicular to the surface on which the deposition is effected, so as to be able to more easily adjust homogeneously the temperature conditions at any level of the device, According to the invention, the method of epitaxially depositing a semiconductor compound on a substrate, which deposition is carried out in a space in the presence of a vapour containing at least one component of the compound and in which a surface of the substrate is covered with a liquid, saturated solution of the compound in a solvent in the presence of the vapour and in which the solution is previously saturated in a part of the space after which the solution is provided on the surface, is characterized in that a minimum volume of the solution is saturated in a part of the space which is present above the substrate and where a uniform temperature prevails which is equal to the temperature of deposition, and the surface of the substrate is placed horizontally in the space where a vertical, constant and fixed temperature gradient has been adjusted, so that the substrate is at a temperature which is lower than that of the solution, and that the part of the space between the part where the solution is made and the substrate is kept is at a temperature which is higher than that of the deposition.

The volume of the solution which is used during the deposition is minimum, and does not interfere with the temperature distribution in the space during its transport. The saturation of the solution is carried out in a part of the space under readily determined and constant conditions, The temperature gradient at the boundary surface of the solution during the deposition is perpendicular to the surface of deposition, is homogeneous throughout said surface, and enables a homogeneous deposit of uniform thickness to be obtained; by the temperature gradient a crystallisation rate is fixed which in addition is controlled by means of the vapour which is introduced into the space, for example, as a flow of vapour. The vapour flows through a region which is kept at a temperature which is higher than that of the deposition, as a result of which the oversaturation of the solution during the deposition can be maintained; the rate of deposition can be controlled in particular by simply controlling the flow of vapour or the concentrations in said flow of vapour.

On the other hand the temperature constancy makes it possible for said temperatures to be supervised accurately and hence all conditions for a good reproducibility are present.

THe substrate is preferably etched by a flow of a reactive vapour immediately preceding the coating of the substrate by the solution; thus the etching products are not retained in the liquid.

The small volume of the solution results in a small thickness of the layer of liquid on the substrate which is a cause of the good quality of the surface of the deposit. According to a preferred embodiment of the method according to the invention, the volume of the solution used is chosen in accordance with a minimum thickness of the liquid phase on the surface on which the deposition is carried out, said thickness being nevertheless large enough to obtain a flat liquid surface, with which differences in thickness are also avoided as a result of surface tension of the liquid.

The temperature gradient during deposition is preferably chosen to be between 5° and 50°C per cm, and preferably between 10° and 20°C per cm. The rate of deposition can be controlled to a certain extent by the value of the gradient, The method for the epitaxial deposition is usually carried out in so-called reactors, in which two defined temperature zones are present. The known devices usually comprise a horizontal reactor and means to tilt a boat containing the solution above the substrate. Such a device is described, for example, in the abovementioned French Patent Specification. In such a device the saturation of the solution and the growth are carried out in the same part of the reactor, the temperature of which varies with time. Furthermore, in a horizontal device the axis of which extends parallel to the surface of the substrate, it is difficult to adjust a steep temperature gradient perpendicular to the surface of the substrate and at the same time a constant temperature parallel to said surface in order to avoid temperature differences from one point to the other of the surface of deposition which may result in important variations of the thickness of the deposit.

The invention also relates to a device for carrying out the method according to the invention, the object of which is to avoid the above-mentioned drawbacks at least considerably and to obtain expitaxial deposits under circumstances which are as favourable as possible as regards regularity, accuracy and reproducibility.

According to the invention, the device for the epitaxial deposition in a vertical closed reactor comprises means to saturate a solution, means to contact the solution with the substrate, and means to maintain a saturation vapour pressure above the solution.

This device is characterized in that in a first part of the reactor the bottom of a crucible containing the saturated solution is provided with a control valve and the substrate can be provided below the control valve in a boat which is provided with an outlet valve.

The contact of the deposition surface with the solution can be interrupted by means of the outlet valve and thus the deposition process can be stopped at a given instant. In a preferred embodiment, the reactor of the device is a vertical silicon oxide tube. With this shape, the reactor can be placed in a vertical tube furnace in which a vertical temperature gradient as well as a uniform temperature at a horizontal level can be adjusted. When the substrate has small dimensions, the crucible, the boat and the valve can be given shapes of revolution and be placed in the axis of the reactor of the furnace. The substrate is preferably fixed on an outlet valve of the boat rotatable about a shaft. When the substrate is manipulated by means of the valve, it assumes an inclined position, if necessary a vertical position, so that drops of the solution which remain sticking to the substrate can be removed. In a variation of the construction the substrate is fixed on the bottom of the boat which can rotate about a shaft; by emptying the boat as a result of tilting, the above-mentioned drops can be removed.

In another variation of the device, the substrate is supported by a transverse rod which is rotatable about a shaft and with which the substrate can be tilted so as to remove the drops.

In order that the invention may be readily carried into effect, it will now be described in greater detail, by way of example, with reference to the accompanying diagrammatic drawings, in which:

FIG. 1 is a diagrammatic vertical cross-sectional view of a device in a first stage of carrying out the method according to the invention, FIG. 2 is a vertical cross-sectional view of the device in a following stage of the performance of the method of the invention, FIG. 3 is a diagrammatic vertical cross-sectional view of a part of the device in a final stage of carrying out the method according to the invention.

Figure 1:
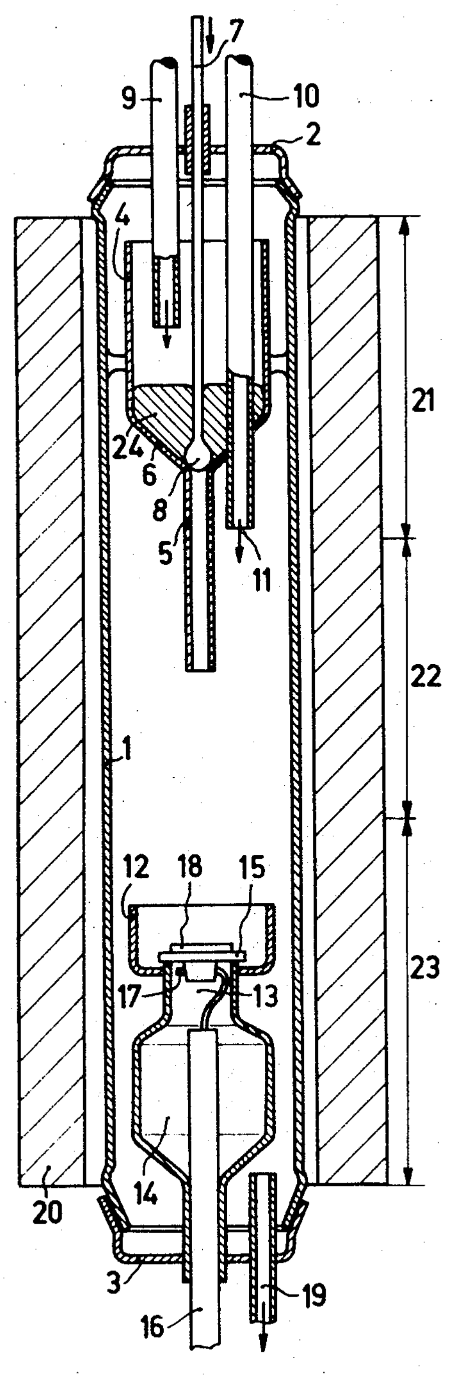
Figures 3, 4, 5:
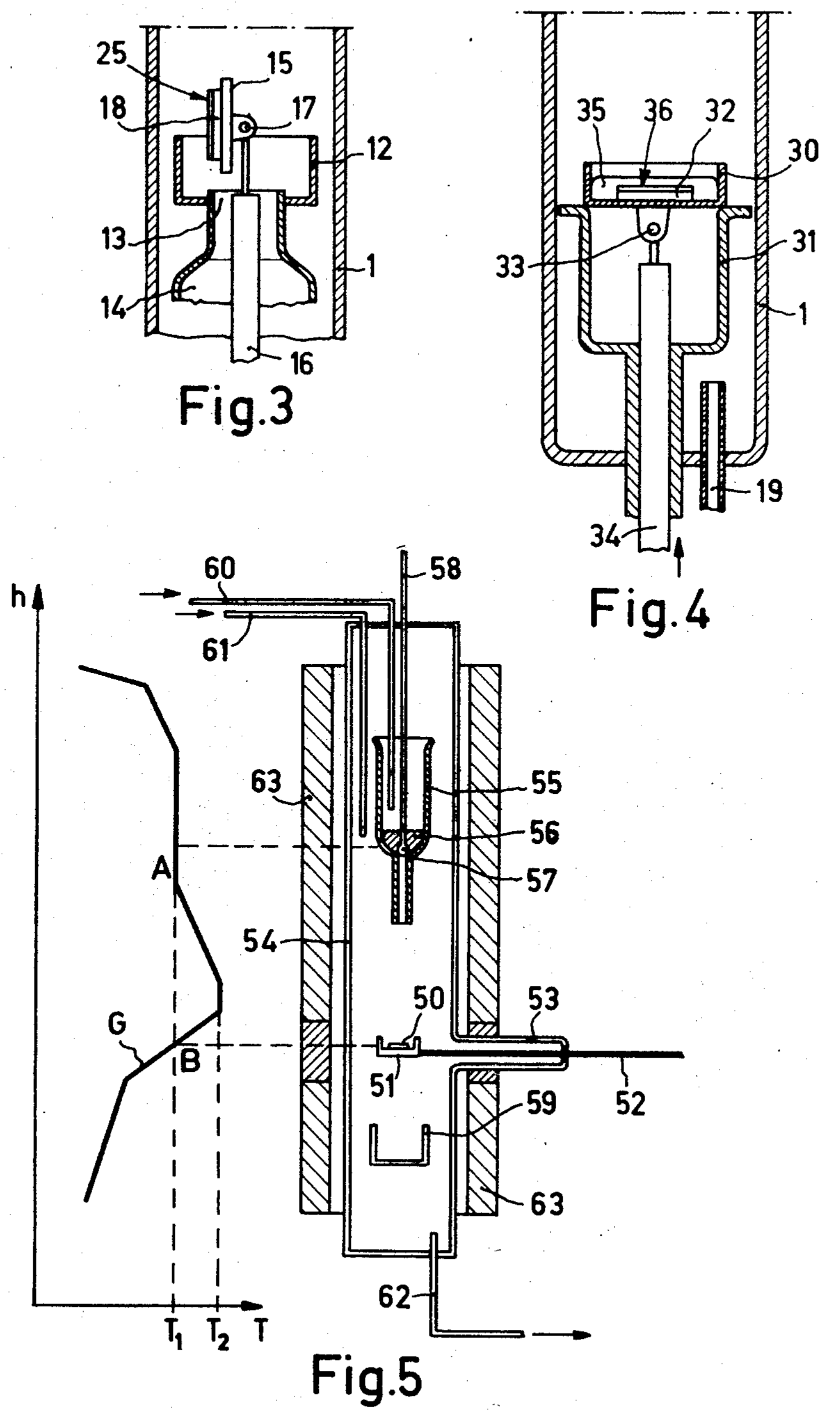
FIG. 4 is a diagrammatic vertical cross-sectional view of a part of another device in a stage of the performance of the method according to the invention.
FIG. 5 is a diagrammatic vertical cross-sectional view of a variation of the device for carrying out the method according to the invention.

The device according to the invention as shown in FIGS. 1 and 3 is constituted by a tube 1 of silicon oxide closed by ground pieces 2 and 3. In the upper part of the tube 1, an open vertical crucible 4 of silicon oxide is placed the conical bottom 6 of which has a tubular aperture 5. This aperture can be closed by means of a rod 7 which passes through the piece 2 and opens into a spherical ground piece 8 which constitutes an outlet valve for the crucible 4 and a control valve for the solution 24, and which can be operated from outside the space.

A certain quantity of vapour for saturating the solution can be introduced into the crucible by means of a tube 9 which opens into the crucible 4. Another flow of gas for etching the substrate can be introduced into the space by means of a second tube 10, which opens below the crucible 4 at 11.

In the lower part of the tube 1 a second crucible of silicon oxide 12 is placed the bottom of which comprises an aperture 13 and communicates with a container 14. The aperture 13 is closed by means of a plate 15 which bears on the edge of the aperture and can be lifted by means of a rod 16 through the ground piece 3, on which rod the plate 15 is secured by means of a shaft 17. The plate 15 is suitable for supporting a substrate, for example, a flat disc 18 of monocrystalline semiconductor material which is secured in normal manner, for example, by small hooks of quartz (not shown). Gases are dissipated via the tube 19 through the ground piece 3.

The tube 1 is placed in a vertical tube furnace 20 which has several heating zones which can be regulated and controlled.

At least one zone 21 has a uniform temperature which is equal to the desirable temperature of deposition, a zone 22 has a higher temperature, the maximum temperature is, for example, 50° to 100° higher than that of the zone 21. The zone 23 has a steep gradient which is constant in time and is fixed relative to the substrate at least at the height of the free surface of the substrate 18.

In the performance of the method according to the invention a liquid solution 24 of the compound to be deposited is introduced into the crucible 4, the aperture 5 being closed by means of the rod 7. If we consider, for example, the deposition of gallium arsenide onto a substrate of the same material, then the crucible is filled with a solution of gallium arsenide in gallium. The solution is prepared by leading over via the tube 9 a flow of arsenic trichloride or arsenic hydride in hydrogen. The temperature in this part of the reactor is, for example, 800°C. The saturation depends upon the temperature and can be derived from the phase diagram gallium-arsenic.

The substrate is then etched. Etching vapour, for example, arsenic trichloride or hydrogen chloride in hydrogen are passed through the reactor via the tube 10.

Right after etching, the rod 7 is drawn up as a result of which the aperture 5 is released and the solution flows into the crucible 12 at 25, the substrate 18 (FIG. 12) being covered with a liquid solution of a uniform thickness. The temperature gradient in the zone 23 is 20°C per cm and the temperature of the substrate 18 as well as of the bath 24 is 800°C.

During the deposition which starts immediately, a flow of arsenic trichloride or arsenic hydride is conveyed through the tube 9, while hydrogen is introduced at 11, if necessary. The quantity of these gases is determined by the saturation degree of the solution. As soon as the partial pressure of the arsenic exceeds the value which corresponds to that of a saturated solution of gallium arsenide, the solution is oversaturated near the surface and a surface layer of gallium arsenide attempts to form. This layer is in equilibrium, on the one hand with the vapour phase, on the other hand with the liquid. The arsenic diffuses in the liquid of the surface towards the substrate.

The deposition is interrupted by lifting the plate 15 by means of the rod 16. The liquid solution then flows into the container 14 (FIG. 3). Due to the shaft 17, the platform 15 is tilted and the drops which might remain behind on the surface of the deposit are removed.

Figure 2:
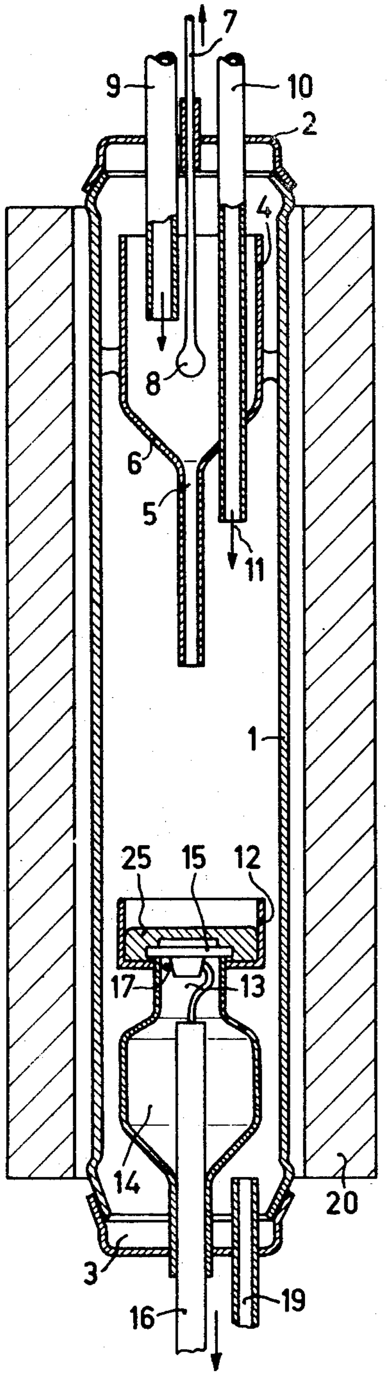

The device shown in FIG. 4 is a variation of the construction as regards the crucible in which the deposition is carried out. The device is used in the same manner as the device shown in FIGS. 1 to 3. The solution is poured out of the crucible 4 into the crucible 30 which is placed on the edge of the container 31. The crucible 30 which serves as a support for the substrate 32 is present on a shaft 33 which is rigidly secured to a rod 34. The deposition process is interrupted, as before, by lifting the crucible 30 by means of the rod 34. The crucible 30 is tilted and the liquid solution 35 flows into the container 31, the drops which might remain on the surface of the deposit 36 being simultaneously removed.

In the device diagrammatically shown in FIG. 5, the substrate 50 is fixed in a boat 51 which also serves as a substrate support, the boat being supported by a horizontal rod 52, by means of which the boat can be tilted. This rod is mounted on a side arm 53 of the tubular vertical space 54. This arm has dimensions which are as small as possible so as not to influence the temperature at the level of the substrate.

As in the above-described devices, a crucible 55 in the interior of the space 54 comprises the solution 56 which is saturated in the crucible. This comprises a control valve 57 which can be operated by means of a rod 58. A container 59 receives the excessive solution. The space 54 comprises a tube 61 which is destined for injection of a carrier gas with etching vapour. A tube 62 serves for the dissipation of gas. The space 54 is placed in a furnace 63 and this furnace is controlled to adjust in the axial direction of the space a temperature distribution which corresponds to the graph shown in the left-hand side of FIG. 5 and which is related to the diagrammatic representation of the device.

The solution is uniformly saturated at a temperature $T_1$. The substrate is placed in a temperature gradient G, so that the interface solid-liquid during crystallisation is at a temperature $T_1$. This gradient makes it necessary that between the points A and B of the graph, the temperature rises to $T_2$ in the region through which the solution flows during the coating of the substrate.

In the case in which the deposited material is to contain a certain content of doping material, namely an impurity which gives the semiconductor body a certain impurity type, said impurity can be added to the solution in the crucible in which the solution is made. It is alternatively possible to lead a dilute doping gas over the solution simultaneously with the saturation gas.

The method according to the invention can be applied to all VLS methods for the epitaxial deposition, and in particular for the deposition of epitaxial layers of high crystallographic quality, as they are required in the manufacture of special semiconductor devices, for example, high frequency semiconductor devices, Gunn effect devices and electroluminescent devices. The compounds contain at least one element of the third group and one element of the fifth group of the periodic system of elements, or at least one element of the second group and one element of the sixth group, so-called $A^{III}B^{V}$ and $A^{II}B^{VI}$ compounds. These can advantageously be deposited epitaxially by means of the method according to the invention.

The above description on the epitaxial deposition of a semiconductor compound is to be understood to include also mixtures of semiconductor compounds such that, upon epitaxial deposition, mixed crystals, for example $GaAs_xP_{1-x}$ are obtained.

During the preparation and crystallisation of the saturated solution, the vapour phase must have such partial vapour pressures of As and P as, in equilibrium, a saturated solution has from which a mixed crystal of the desirable composition can crystallize. The epitaxial deposition process can also be repeated, for example, in successive stages with different impurities, for example, to obtain p-n junctions or/and with different compositions to obtain junctions between various compounds, so-called hereto junctions.

What is claimed is:

1. A method of epitaxially depositing a semiconductor compound on a substrate, which comprises: containing a substantially saturated solution of said compound at a uniform temperature in a first zone, maintaining a second zone disposed adjacent and below said first zone at a uniform temperature higher than the temperature of said first zone, positioning said substrate substantially horizontally in a crucible which is disposed at the bottom of a third zone, said third zone being disposed adjacent and below said second zone, maintaining a temperature gradient which is constant in time in said third zone so that the temperature changes from a high temperature at the portion of said third zone adjacent said second zone which is substantially equivalent to the temperature of said second zone to a low temperature at the surface of said substrate which low temperature is below the temperature of said solution in said first zone, said gradient being substantially perpendicular to the surface of said substrate, flooding said crucible with at least a portion of said solution from said first zone so that said substrate is covered with a uniform thickness of said solution while in the presence of a vapor containing at least one component of the compound, interrupting the deposition of said compound on said substrate when a predetermined thickness of compound is deposited on said substrate by draining said solution from said crucible whereby the surface of deposition of said substrate is maintained at a constant temperature and the thickness of said deposited layer is even.

2. A method as claimed in claim 1, wherein said interrupting step includes the inclining of said substrate to drain off all the remaining part of said solution from the surface of said substrate.

3. A method as claimed in claim 1, wherein said temperature gradient of said second zone is chosen to be between 10° and 20° C per cm.

4. A method as claimed in claim 1, wherein the temperature in said first zone is 800°C and gallium-arsenide is deposited onto a substrate of gallium-arsenide and said solution is gallium-arsenide in gallium.

5. A method as claimed in claim 4, wherein said solution is prepared by leading a flow of arsenic trichloride in hydrogen.

6. A method as claimed in claim 1 wherein said substrate is etched by a flow of a reactive vapor immediately preceding the flooding step.

7. A method as claimed in claim 1, wherein the volume of said solution used is chosen in accordance with a minimum thickness of the liquid phase on the surface on which the deposition is carried out, said thickness nevertheless being large enough to obtain a flat liquid surface.

8. A method as claimed in claim 1, wherein said temperature gradient of said second zone is chosen to be between 5° and 50°C per cm.

9. A method as claimed in claim 2, wherein after the inclining of said substrate, said substrate is transferred to a vertical position.

* * * * *